(12) United States Patent
Shirvani-Mahdavi et al.

(10) Patent No.: US 7,339,434 B1
(45) Date of Patent: Mar. 4, 2008

(54) LINEAR-IN-DB VARIABLE GAIN AMPLIFIER USING GEOMETRIC LADDER CIRCUIT

(75) Inventors: Alireza Shirvani-Mahdavi, San Jose, CA (US); George Chien, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 2 days.

(21) Appl. No.: 11/394,561

(22) Filed: Mar. 31, 2006

Related U.S. Application Data

(60) Provisional application No. 60/775,966, filed on Feb. 22, 2006, provisional application No. 60/695,289, filed on Jun. 30, 2005.

(51) Int. Cl.
*H03G 3/12* (2006.01)
(52) U.S. Cl. .................................. 330/282; 330/278
(58) Field of Classification Search ................ 330/51, 330/282, 254, 278, 284
See application file for complete search history.

(56) References Cited

U.S. PATENT DOCUMENTS

| | | |
|---|---|---|
| 4,467,286 A | 8/1984 | Stitt |
| 5,128,675 A | 7/1992 | Harada |
| 5,394,019 A | 2/1995 | Audy |
| 5,781,140 A | 7/1998 | Kao |
| 5,973,566 A * | 10/1999 | Leiby .................. 330/282 |
| 6,445,248 B1 * | 9/2002 | Gilbert ................ 330/51 |
| 6,882,294 B2 | 4/2005 | Linder et al. |
| 6,975,261 B1 | 12/2005 | Isham |
| 7,102,441 B2 | 9/2006 | Lee et al. |
| 7,154,421 B2 * | 12/2006 | Devendorf et al. ....... 341/118 |

OTHER PUBLICATIONS

Fattaruso, J.W., "Nonlinear analog function synthesis with MOS technology," Dissertation thesis submitted in partial satisfaction of the requirements for the degree of Doctor of Philosophy in Engineering in the Graduate Division of the University of California, Berkeley.

* cited by examiner

*Primary Examiner*—Henry Choe

(57) ABSTRACT

A variable gain amplifier uses a geometric ladder circuit that produces a transfer function having substantially uniform steps measured in dB. Where the ladder has a plurality of substantially identical resistor rungs of a first resistance, one stile that is a conductor connecting the rungs, and another having a series of substantially identical resistors of a second resistance, then for identical inputs at different rungs, the output signal at an end of the ladder is attenuated by a number of substantially equal steps, one for each rung between input and output. For a ladder with a base rung R, an output at an end opposite the base rung, stile resistors of resistance $\alpha R$, and other rungs all of resistance $(1+(1/\alpha))R$, the step size is $20 \log_{10}(1+\alpha)$. By using such ladders in op-amp feedback loops, chaining different stages with different values of $\alpha$, coarse and fine gain adjustment can be provided.

25 Claims, 9 Drawing Sheets

US 7,339,434 B1

LINEAR-IN-DB VARIABLE GAIN AMPLIFIER USING GEOMETRIC LADDER CIRCUIT

CROSS REFERENCE TO RELATED APPLICATION

This claims the benefit of copending, commonly-assigned U.S. Provisional Patent Applications Nos. 60/695,289 and 60/775,966, filed Jun. 30, 2005 and Feb. 22, 2006, respectively, each of which is hereby incorporated herein by reference in its respective entirety.

BACKGROUND OF THE INVENTION

This invention relates to a variable gain amplifier incorporating a resistor ladder circuit with a linear-in-dB transfer function, to provide an output with linear-in-dB gain steps.

In many electronic applications it is necessary or preferred to be able to adjust signal levels in steps that are linear when measured in decibels, or "linear-in-dB." Because intensity in decibels is a logarithmic function, this means that circuits that act logarithmically, or can mimic logarithmic activity, are desirable.

Bipolar transistors, by the exponential nature of the physics of their operation, are inherently logarithmic in operation. However, most electronic devices are now integrated devices that are not inherently logarithmic. Thus, various techniques are used to create or approximate linear-in-dB output from such devices. For example, resistive ladders can be constructed, in which any resistor can serve as the input tap, providing different outputs. By choosing particular resistor values, transfer functions that are linear-in-dB can be obtained or at least approximated.

However, there is no regular, rational relationship among the values of the resistors in the ladder. The values simply have to be calculated, practically by trial-and-error, for each application. Even then, the result may only approximate linear-in-dB operation.

In another approach, a variable gain amplifier—e.g., using a current mirror—can be constructed, with a multi-bit control input to create a transfer function with many steps. For example, with a 10-bit control signal, $2^{10}$ steps can be created. Of the 1,024 steps of the resulting transfer function, the designer can then select—essentially by hand—those steps that, taken together, mimic linear-in-dB behavior. The other steps remain unused. This approach therefore requires significant overhead in unused steps to obtain enough steps to approximate linear-in-dB behavior.

It would be desirable to be able to provide a variable gain amplifier that provides a true linear-in-dB output with little or no unnecessary overhead.

SUMMARY OF THE INVENTION

In accordance with this invention, a variable gain amplifier is provided with a substantially true linear-in-dB transfer function. The variable gain amplifier is based on a geometric resistive ladder, preferably based on a base resistance R and a "ladder constant" $\alpha$.

In discussing the invention, the analogy to an ordinary household ladder will be maintained to facilitate reference to the different resistors in the geometric resistive ladder. Thus, the resistors that make up the crossbars of the ladder will generally be referred to herein as "rungs" or "rung resistors," while the resistors that run along the sides will be referred to as "stiles" or "stile resistors."

Preferably, each rung of the ladder can serve as an input tap and the output is taken at one end of the ladder. For a given input signal, the output transfer function ideally will be a constant amount in dB multiplied by the number of rungs between the input and the output. For certain properly chosen values of $\alpha$, certain useful step sizes can be provided. For example, $\alpha=\frac{1}{17}$ provides steps very close to 0.5 dB, while $\alpha=\frac{1}{3}$ provides steps very close to 2.5 dB. It will be recognized that in practice, process and other variations, as well as the presence of parasitic resistances, may case the transfer function to deviate from the ideal. Nevertheless it can be expected to be close to, or substantially equal to, the ideal. Such a resistive ladder is described in detail in copending, commonly-assigned U.S. patent application Ser. No. 11/394,586, filed concurrently herewith, which is hereby incorporated by reference herein in its entirety.

In a preferred embodiment of a variable gain amplifier in accordance with the present invention, a resistive ladder of the type described above is used in the feedback loop of an amplifier, such as an operational amplifier, to produce gain having steps that are linear-in-db. In a first preferred embodiment, a desired gain range can be achieved by providing in the feedback loop a resistive ladder as described having steps of a certain size in dB, with the number of steps chosen to achieve the desired overall gain range. Preferably, during operation any particular rung of the ladder can be switchably selected to provide a particular gain within that gain range. The switches preferably are digitally controllable.

Such an arrangement can become inefficiently large, however, as the gain range increases. Therefore, in a second preferred embodiment, multiple amplifier stages are used. In a first stage, a first ladder having a smaller number of relatively large steps, making up the desired range, is provided. In a second stage, a second ladder having a number of smaller steps is provided. Preferably, the size of the larger step is substantially an integral multiple of the size of the smaller step, and the number of smaller steps is selected so that the range of the second stage is substantially equal to the size of one of the larger steps of the first stage. In such an arrangement, the first stage provides coarse tuning of the gain while the second stage provides fine tuning of the gain, generally with a savings in area and numbers of components.

For example, to provide a range of 10 dB in steps of 0.5 dB, a 21-rung (20-step) resistive ladder can be used, with $\alpha=\frac{1}{17}$. That would require 21 of each component that makes up a rung, and twenty controllable switches. According to the second preferred embodiment, however, a first stage can be provided having five rungs and four steps, with each step providing about 2.5 dB of gain ($\alpha=\frac{1}{3}$). A second stage can be provided having six rungs and five steps, with each step providing about 0.5 dB of gain ($\alpha=\frac{1}{17}$).

In the second embodiment, the two stages preferably are connected in such a way that the gains of the two stages, measured in dB, are additive. Thus, selecting zero gain in the first stage allows the second stage to provide 0 dB, 0.5 dB, 1.0 dB, 1.5 dB or 2.0 dB of gain. Selecting 2.5 dB of gain in the first stage allows the second stage to provide 2.5 dB, 3.0 dB, 3.5 dB, 4.0 dB or 4.5 dB of gain. Selecting 5.0 dB of gain in the first stage allows the second stage to provide 5.0 dB, 5.5 dB, 6.0 dB, 6.5 dB or 7.0 dB of gain. Selecting 7.5 dB of gain in the first stage allows the second stage to provide 7.5 dB, 8.0 dB, 8.5 dB, 9.0 dB or 9.5 dB of gain. This is achieved with eleven rungs and nine switches instead of 21 rungs and twenty switches.

Thus, in accordance with the present invention, there is provided a variable gain amplifier having a first amplifier component and a first modulating circuit for varying gain of the first amplifier component. The first modulating circuit includes a first resistive ladder circuit having a plurality of first rung resistances, including a plurality of first parallel resistances, each resistance in that plurality of first parallel resistances having a substantially identical rung resistance value. A basic resistance in parallel with that plurality of first parallel resistances has a basic resistance value. A first stile includes a respective first stile resistance connecting respective first ends of respective adjacent ones of the first rung resistances, each of the first stile resistances having a first stile resistance value. A second stile includes a conductor connected to respective second ends of the first rung resistances. The modulating circuit further includes a respective first switch for selecting each said rung. Each of the first ends of each of the first rung resistances is a ladder input of the first resistive ladder circuit. The first resistive ladder circuit has a ladder output across the first and second stiles at an end opposite the basic resistance. The first stile resistance value is a fraction of the basic resistance value. The first rung resistance value is substantially equal to a product of (a) the basic resistance value and (b) 1 plus an inverse of the fraction. For first switches selecting respective outputs separated from one another by a number of rungs, the respective outputs differ in dB by a number of substantially identical first steps equal to the number of rungs. A second stage can be provided with one stage providing coarse adjustment steps and another providing fine adjustment steps.

A method of generating variable gain output steps is also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1 and 2. When in the description below of FIGS. 1 and 2, a component is described by the term "resistor," it should be appreciated that any impedance (with real or complex value, including capacitors or inductors) or other component useful as a resistance can be encompassed by the term "resistor." For example, in an integrated circuit, transistors may be used as a resistors. In addition, a single resistor may be constructed from a plurality of resistors.

Thus, a resistance of, e.g., 4Ω can be constructed from a single 4Ω resistor, or from two 2Ω resistors, or from a 3Ω resistor and a 1Ω resistor. Moreover, while the invention may be implemented as a differential amplifier, for ease of illustration it is described below in single-ended form. However, the principles of the invention are the same for the single-ended and differential cases.

Figure 1:
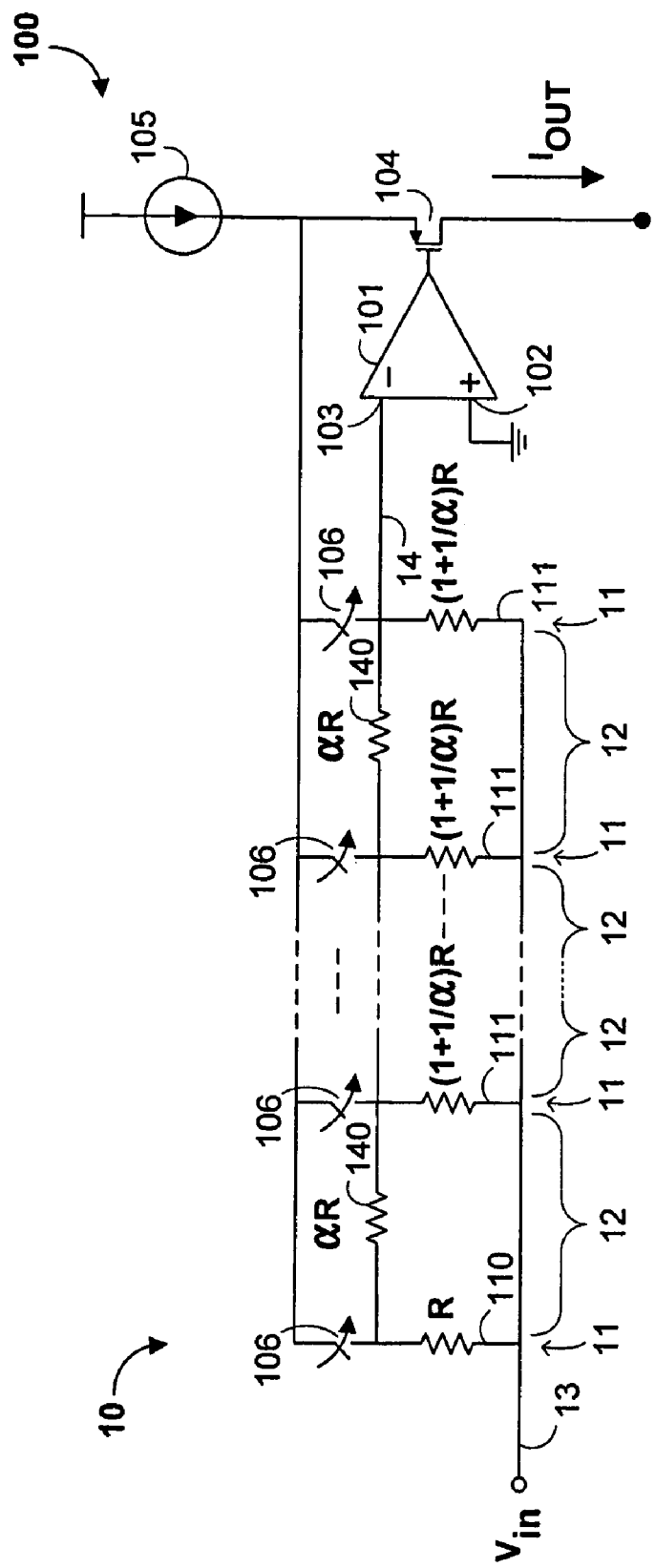
FIG. 1 is a schematic representation of a first preferred embodiment of a variable gain amplifier in accordance with the invention.
Figure 2:
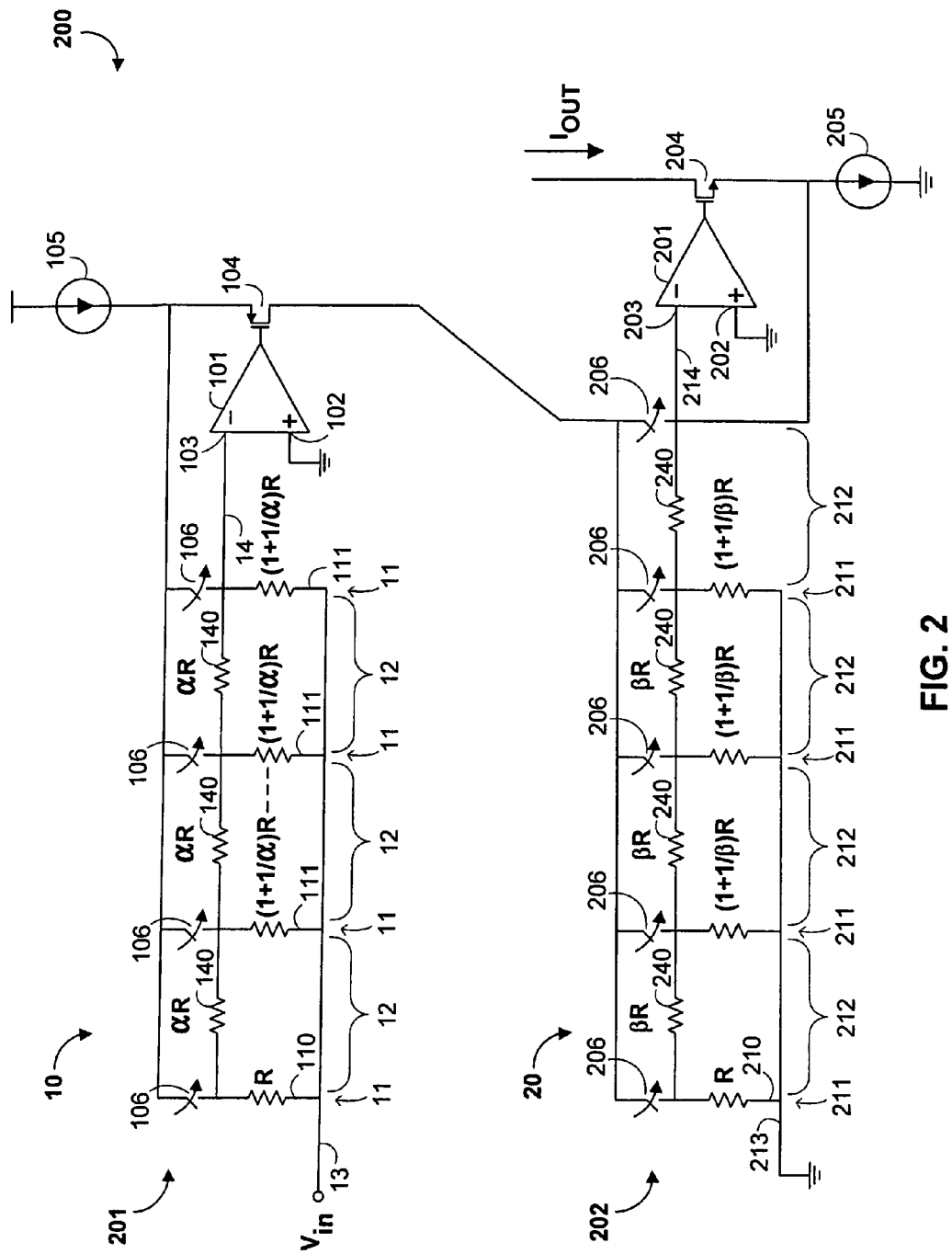
FIG. 2 is a schematic diagram of a second preferred embodiment of a variable gain amplifier in accordance with the invention.

FIG. 1 shows a first preferred embodiment of a variable gain amplifier 100 incorporating a resistive ladder circuit 10 in accordance with the invention, having n+1 rungs 11, and n steps 12. As seen, base rung 110 (the leftmost of rungs 11 as drawn in FIG. 1) preferably has a basic unit of resistance R. Each additional rung 111 preferably has a resistance ideally equal to $(1+(1/\alpha))R$. Lower (as drawn in FIG. 1) stile 13 of ladder 10 preferably is a conductor of nominally zero resistance connected to a source of voltage $V_{IN}$, while upper stile 14 preferably includes, between each rung 11, a resistor 140 having resistance ideally equal to $\alpha R$.

Operational amplifier 101 preferably has its noninverting input 102 connected to ground while its inverting input 103 is connected to stile 14. (In the case of a differential amplifier, there would be two inputs 103, each connected to stile 14 of its own respective ladder 10.) The output of op-amp 101 preferably is connected to the gate of PMOS transistor 104 whose drain is connected to an output port (which in turn can be connected to a load or to another circuit such as another amplifier stage as shown below), and whose source is connected to current source 105. (In the differential case, there would be two outputs driving two output transistors for separate differential outputs.) A plurality of switches 106 preferably is connected between respective rungs 11 of ladder 10 and the source of transistor 104.

It can be shown that the equivalent resistance of ladder 10 is such that the difference in gain, as measured in dB, between the cases of any two adjacent switches 106 being closed is ideally 20 $\log_{10}(1+1/\alpha)$. Useful examples are $\alpha=\frac{1}{17}$, which yields a step of 0.49647 dB or effectively 0.5 dB, and $\alpha=\frac{1}{3}$, which yields a step of 2.49877 dB or effectively 2.5 dB. The absolute voltage is a function of $V_{IN}$.

As discussed above, the circuit of FIG. 1 could be used provide a range of, e.g., twenty steps, such as a 10 dB range with steps of 0.5 dB, using a 21-rung (20-step) resistive ladder, with $\alpha=\frac{1}{17}$. However, that would require 21 of each component that makes up a rung, and twenty controllable switches. Therefore, FIG. 2 shows a two-stage variable gain amplifier 200 using fewer components to achieve the same result.

In amplifier 200, a first stage 201 preferably is essentially the circuit of FIG. 1 (in this case having four rungs 11 and three steps 12), with a second stage 202 preferably inserted between transistor 104 and ground. Because the ladder constant of stage 202 preferably is different from ladder constant $\alpha$ of stage 201, in the description of FIG. 2 the ladder constant of stage 202 will be identified as $\beta$ to avoid confusion. Thus, second stage 202 preferably includes a resistive ladder circuit 20 in accordance with the invention (having in this case five rungs 211 and four steps 212). As seen, base rung 210 (the leftmost of rungs 211 as drawn in FIG. 2) preferably has a basic unit of resistance R. Each additional rung 211 preferably has a resistance ideally equal to (1+(1/β))R. Lower (as drawn in FIG. 2) stile 213 of ladder 20 preferably is a conductor of nominally zero resistance connected to ground, while upper stile 214 preferably includes, between each rung 11, a resistor 240 ideally having resistance βR. Upper stile 214 preferably is one rung longer than lower stile 213 in the direction away from base resistor 210, including one additional stile resistor 240.

A second op-amp 201 preferably has its noninverting input 202 connected to ground while its inverting input 203 is connected to stile 214. (In the case of a differential amplifier, there would be two inputs 203, each connected to stile 14 of its own respective ladder 20.) The output of op-amp 201 preferably is connected to the gate of NMOS transistor 204 whose drain is connected to current source 205, and whose source is the output of amplifier 200. The drain of transistor 204 also preferably is connected to the end of stile 214 adjacent inverting input 203. (In the differential case, there would be two outputs driving two output transistors for separate differential outputs.)

A plurality of switches 206 preferably is connected between respective rungs 211 of ladder 20 and the drain of transistor 104 of stage 201. This connection of stages 201 and 202 sums the gains of each stage as measured in dB. In one possible implementation, α could be made equal to ⅓ so that each step of stage 201 ideally is about 2.5 dB, while β could be made equal to ¹⁄₁₇ so that each step of stage 202 ideally is about 0.5 dB. Thus, selecting zero gain in the first stage allows the second stage to provide 0 dB, 0.5 dB, 1.0 dB, 1.5 dB or 2.0 dB of gain. Selecting 2.5 dB of gain in the first stage allows the second stage to provide 2.5 dB, 3.0 dB, 3.5 dB, 4.0 dB or 4.5 dB of gain. Selecting 5.0 dB of gain in the first stage allows the second stage to provide 5.0 dB, 5.5 dB, 6.0 dB, 6.5 dB or 7.0 dB of gain. Selecting 7.5 dB of gain in the first stage allows the second stage to provide 7.5 dB, 8.0 dB, 8.5 dB, 9.0 dB or 9.5 dB of gain. This is achieved with eleven rungs and nine switches instead of 21 rungs and twenty switches. In this way, stage 201 may be considered the coarse adjustment stage, while stage 202 may be considered the fine adjustment stage.

It should be noted that within stage 201, resistances of value αR and (1+1/α)R can be constructed as parallel and series combinations, respectively, of resistances all having resistance R, just as within stage 202, resistances of value βR and (1+/β)R can be constructed as parallel and series combinations, respectively, of resistances all having resistance R, as described in more detail in above-incorporated, concurrently-filed application Ser. No. 11/394,586. However, while process-wise it may be easier for all resistances to have the same value, there is no inherent reason why the base resistances in both stages must have the same value. As discussed above, the per-step gain is a function of α (or β) and therefore independent of R, so that R could be different as between stages 201 and 202.

Referring now to FIGS. 3-9 various exemplary implementations of the present invention are shown.

Figure 3:
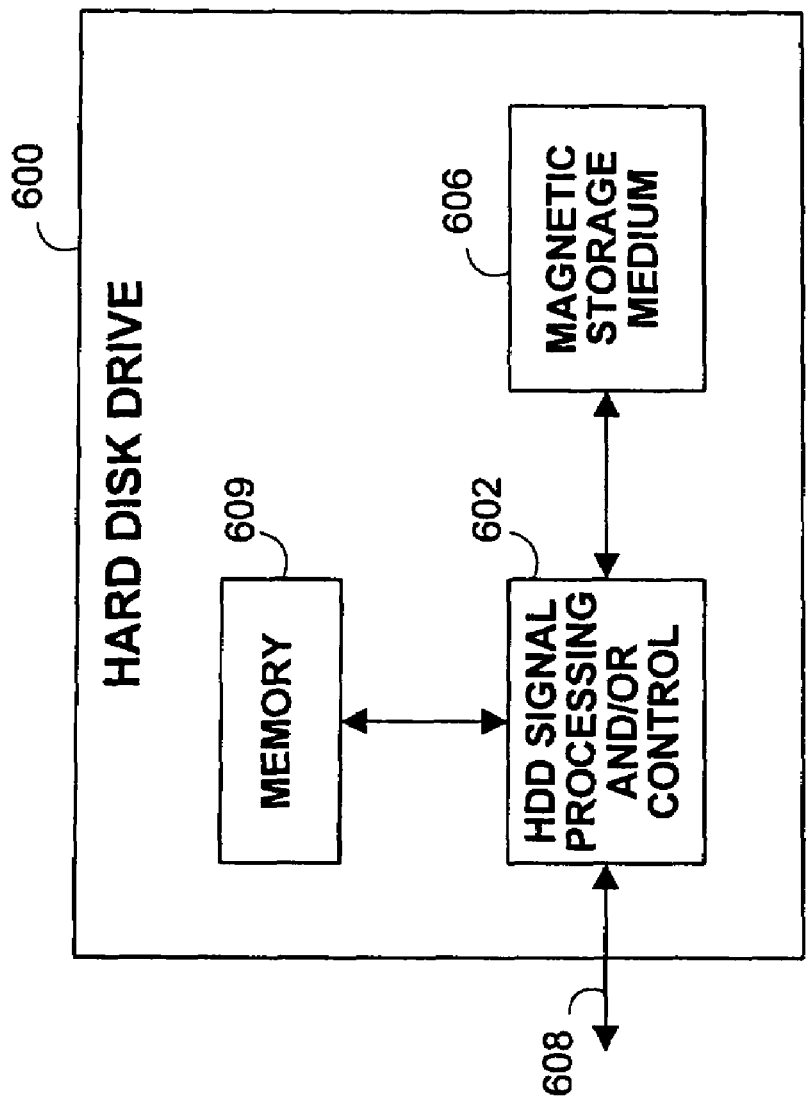
FIG. 3 is a block diagram of an exemplary hard disk drive that can employ the disclosed technology.

Referring now to FIG. 3 the present invention can be implemented in a hard disk drive 600. The present invention may implement either or both signal processing and/or control circuits, which are generally identified in FIG. 3 at 602. In some implementations, the signal processing and/or control circuit 602 and/or other circuits (not shown) in the HDD 600 may process data, perform coding and/or encryption, perform calculations, and/or format data that is output to and/or received from a magnetic storage medium 606.

The HDD 600 may communicate with a host device (not shown) such as a computer, mobile computing devices such as personal digital assistants, cellular telephones, media or MP3 players and the like, and/or other devices, via one or more wired or wireless communication links 608. The HDD 600 may be connected to memory 609 such as random access memory (RAM), low latency nonvolatile memory such as flash memory, read only memory (ROM) and/or other suitable electronic data storage.

Figure 4:
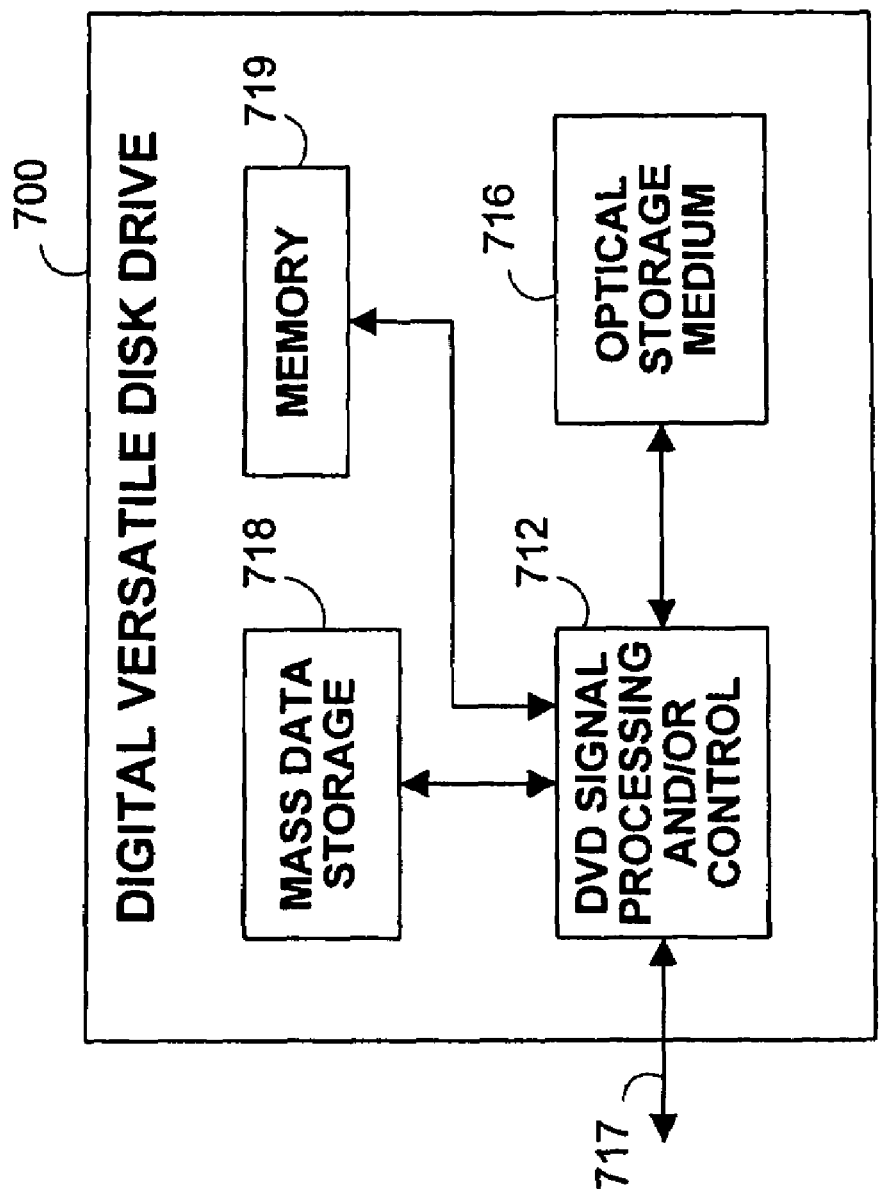
FIG. 4 is a block diagram of an exemplary digital versatile disk drive that can employ the disclosed technology.

Referring now to FIG. 4 the present invention can be implemented in a digital versatile disk (DVD) drive 700. The present invention may implement either or both signal processing and/or control circuits, which are generally identified in FIG. 4 at 712, and/or mass data storage of the DVD drive 700. The signal processing and/or control circuit 712 and/or other circuits (not shown) in the DVD drive 700 may process data, perform coding and/or encryption, perform calculations, and/or format data that is read from and/or data written to an optical storage medium 716. In some implementations, the signal processing and/or control circuit 712 and/or other circuits (not shown) in the DVD drive 700 can also perform other functions such as encoding and/or decoding and/or any other signal processing functions associated with a DVD drive.

DVD drive 700 may communicate with an output device (not shown) such as a computer, television or other device, via one or more wired or wireless communication links 717. The DVD drive 700 may communicate with mass data storage 718 that stores data in a nonvolatile manner. The mass data storage 718 may include a hard disk drive (HDD). The HDD may have the configuration shown in FIG. 3 The HDD may be a mini-HDD that includes one or more platters having a diameter that is smaller than approximately 1.8". The DVD drive 700 may be connected to memory 719 such as RAM, ROM, low-latency nonvolatile memory such as flash memory, and/or other suitable electronic data storage.

Figure 5:
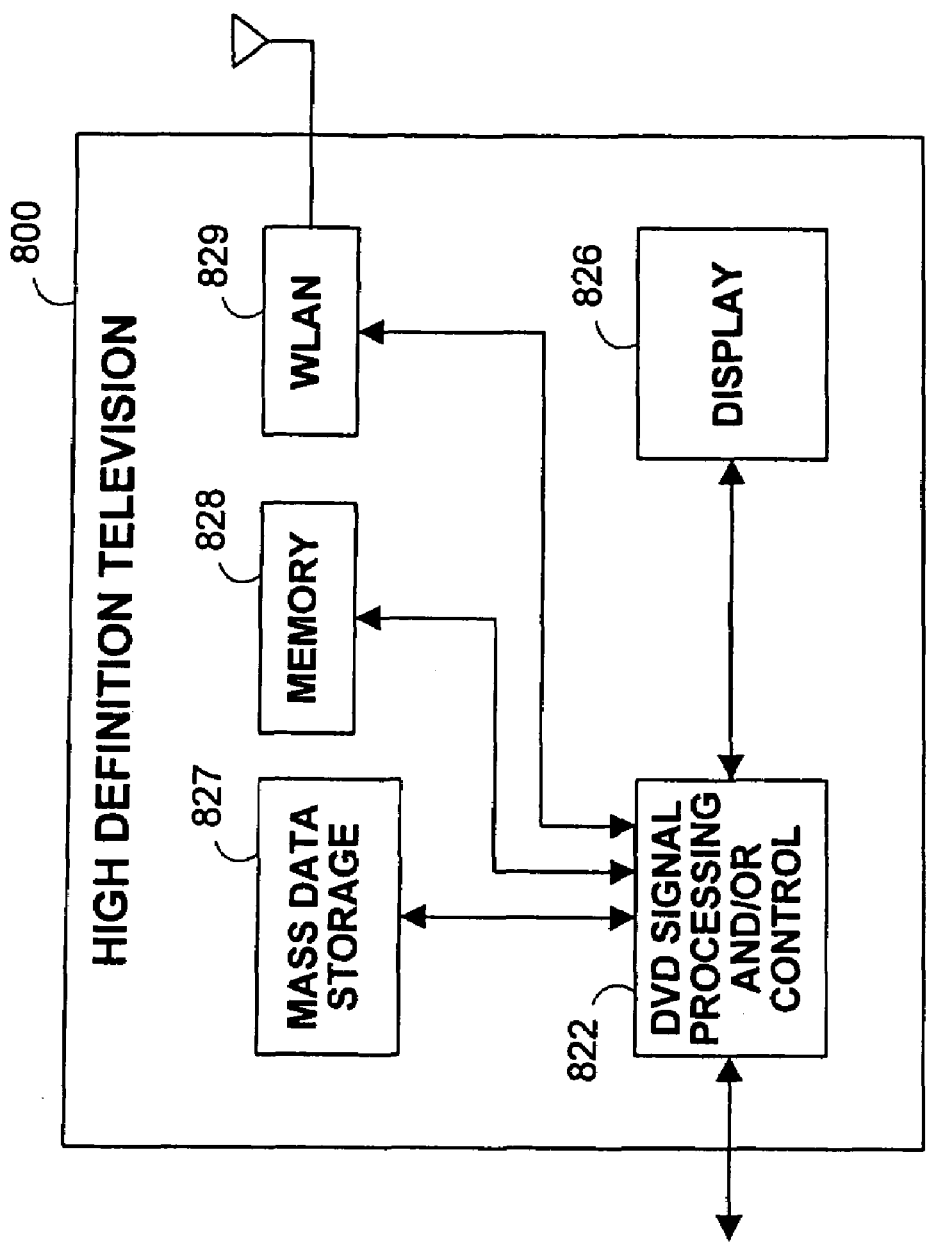
FIG. 5 is a block diagram of an exemplary high definition television that can employ the disclosed technology.

Referring now to FIG. 5, the present invention can be implemented in a high definition television (HDTV) 800. The present invention may implement either or both signal processing and/or control circuits, which are generally identified in FIG. 5 at 822, a WLAN interface and/or mass data storage of the HDTV 800. The HDTV 800 receives HDTV input signals in either a wired or wireless format and generates HDTV output signals for a display 826. In some implementations, signal processing circuit and/or control circuit 822 and/or other circuits (not shown) of the HDTV 820 may process data, perform coding and/or encryption, perform calculations, format data and/or perform any other type of HDTV processing that may be required.

The HDTV 800 may communicate with mass data storage 827 that stores data in a nonvolatile manner such as optical and/or magnetic storage devices. At least one HDD may have the configuration shown in FIG. 3 and/or at least one DVD drive may have the configuration shown in FIG. 4. The HDD may be a mini-HDD that includes one or more platters having a diameter that is smaller than approximately 1.8". The HDTV 800 may be connected to memory 1028 such as RAM, ROM, low-latency nonvolatile memory such as flash memory, and/or other suitable electronic data storage. The HDTV 800 also may support connections with a WLAN via a WLAN network interface 829.

Figure 6:
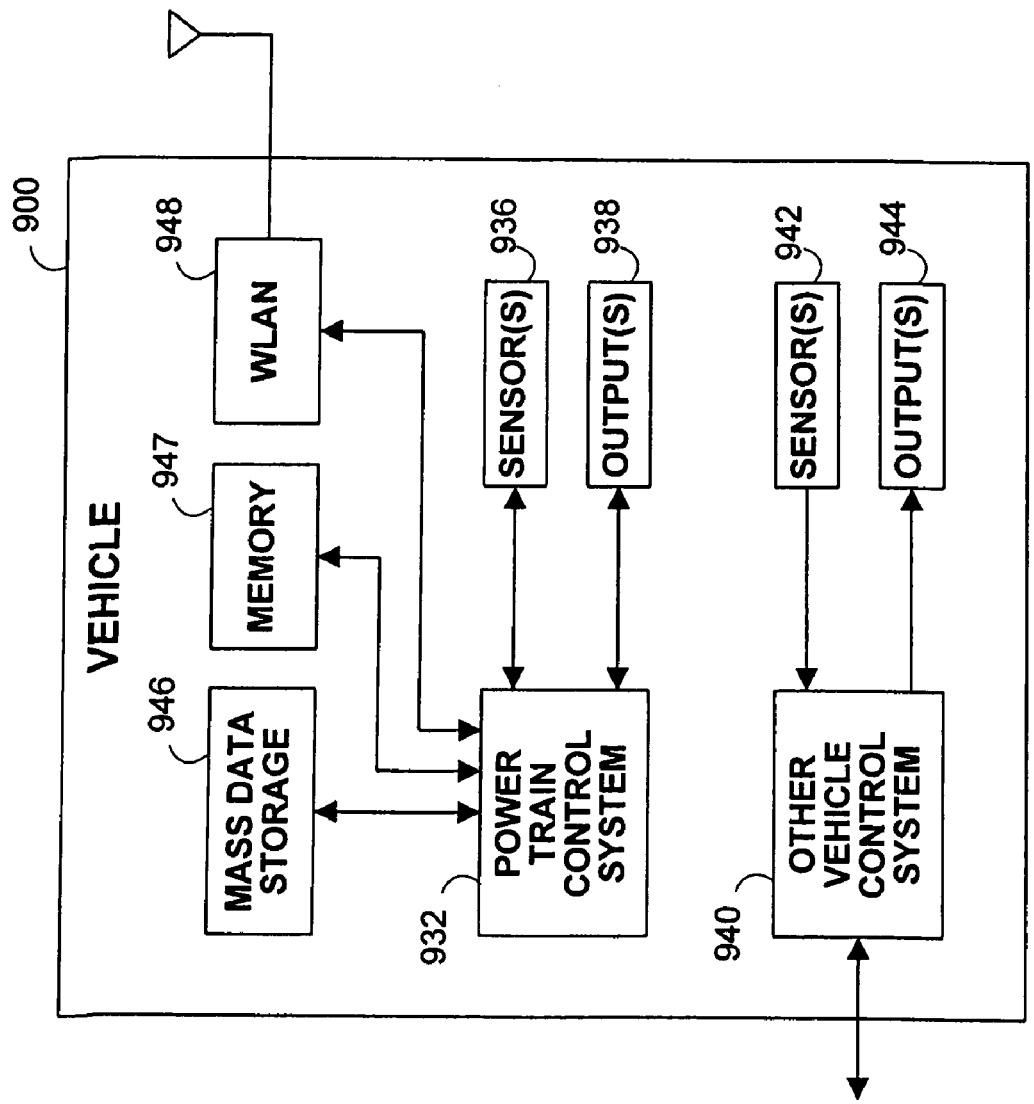
FIG. 6 is a block diagram of an exemplary vehicle that can employ the disclosed technology.

Referring now to FIG. 6, the present invention implements a control system of a vehicle 900, a WLAN interface and/or mass data storage of the vehicle control system. In some implementations, the present invention may implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 940 of the vehicle 900. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices for example hard disk drives HDD and/or DVDs. At least one HDD may have the configuration shown in FIG. 3 and/or at least one DVD drive may have the configuration shown in FIG. 4. The HDD may be a mini-HDD that includes one or more platters having a diameter that is smaller than approximately 1.8". The powertrain control system 932 may be connected to memory 947 such as RAM, ROM, low latency nonvolatile memory such as flash memory, and/or other suitable electronic data storage. The powertrain control system 932 also may support connections with a WLAN via a WLAN network interface 948. The control system 940 may also include mass data storage, memory and/or a WLAN interface (none shown).

Figure 7:
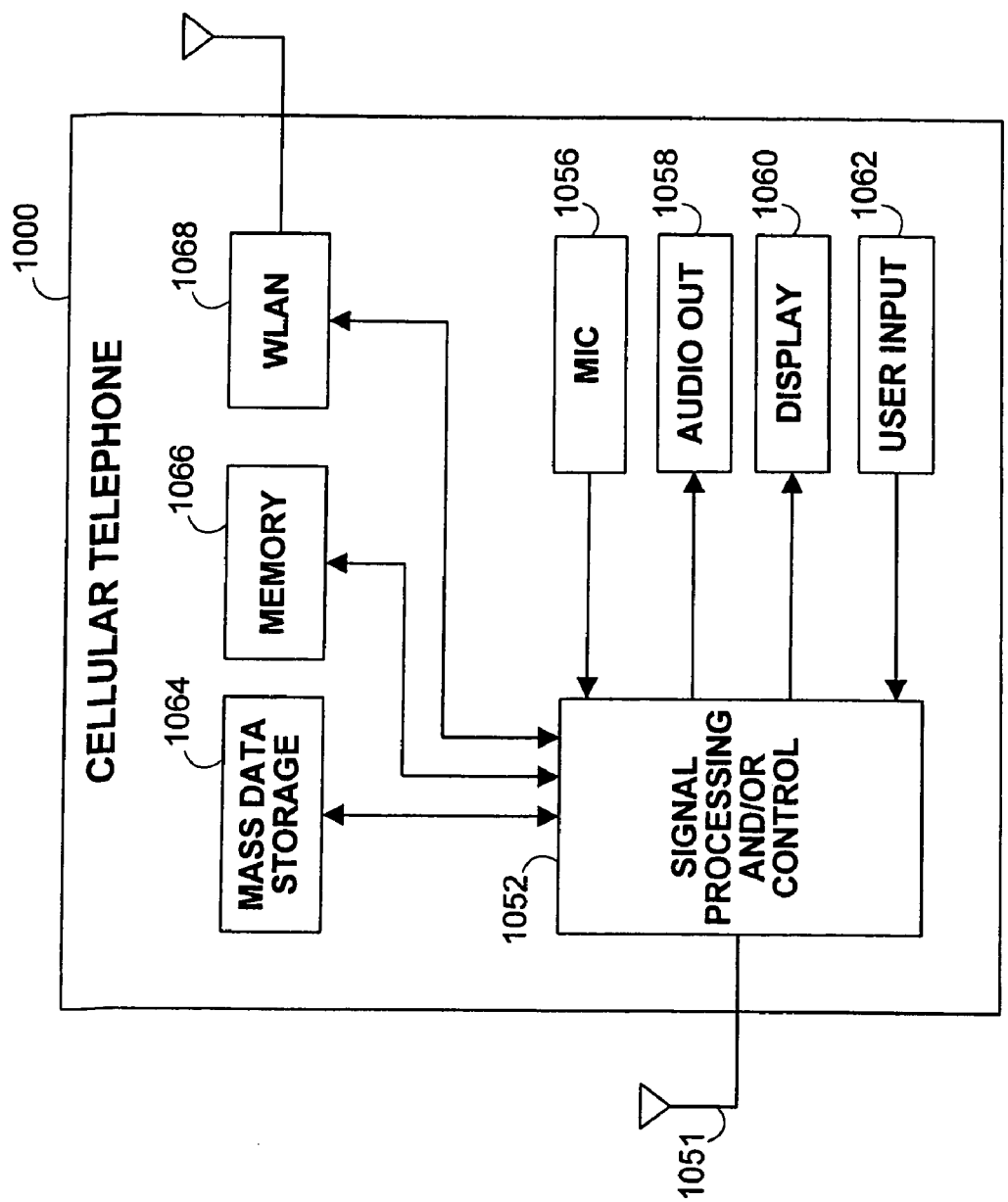
FIG. 7 is a block diagram of an exemplary cellular telephone that can employ the disclosed technology.

Referring now to FIG. 7, the present invention can be implemented in a cellular telephone 1000 that may include a cellular antenna 1051. The present invention may implement either or both signal processing and/or control circuits, which are generally identified in FIG. 7 at 1052, a WLAN interface and/or mass data storage of the cellular phone 1050. In some implementations, the cellular telephone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular telephone 1050 may process data, perform coding and/or encryption, perform calculations, format data and/or perform other cellular telephone functions.

The cellular telephone 1050 may communicate with mass data storage 1064 that stores data in a nonvolatile manner such as optical and/or magnetic storage devices—for example hard disk drives (HDDs) and/or DVDs. At least one HDD may have the configuration shown in FIG. 3 and/or at least one DVD drive may have the configuration shown in FIG. 4. The HDD may be a mini-HDD that includes one or more platters having a diameter that is smaller than approximately 1.8". The cellular telephone 1000 may be connected to memory 1066 such as RAM, ROM, low-latency nonvolatile memory such as flash memory, and/or other suitable electronic data storage. The cellular telephone 1000 also may support connections with a WLAN via a WLAN network interface 1068.

Figure 8:
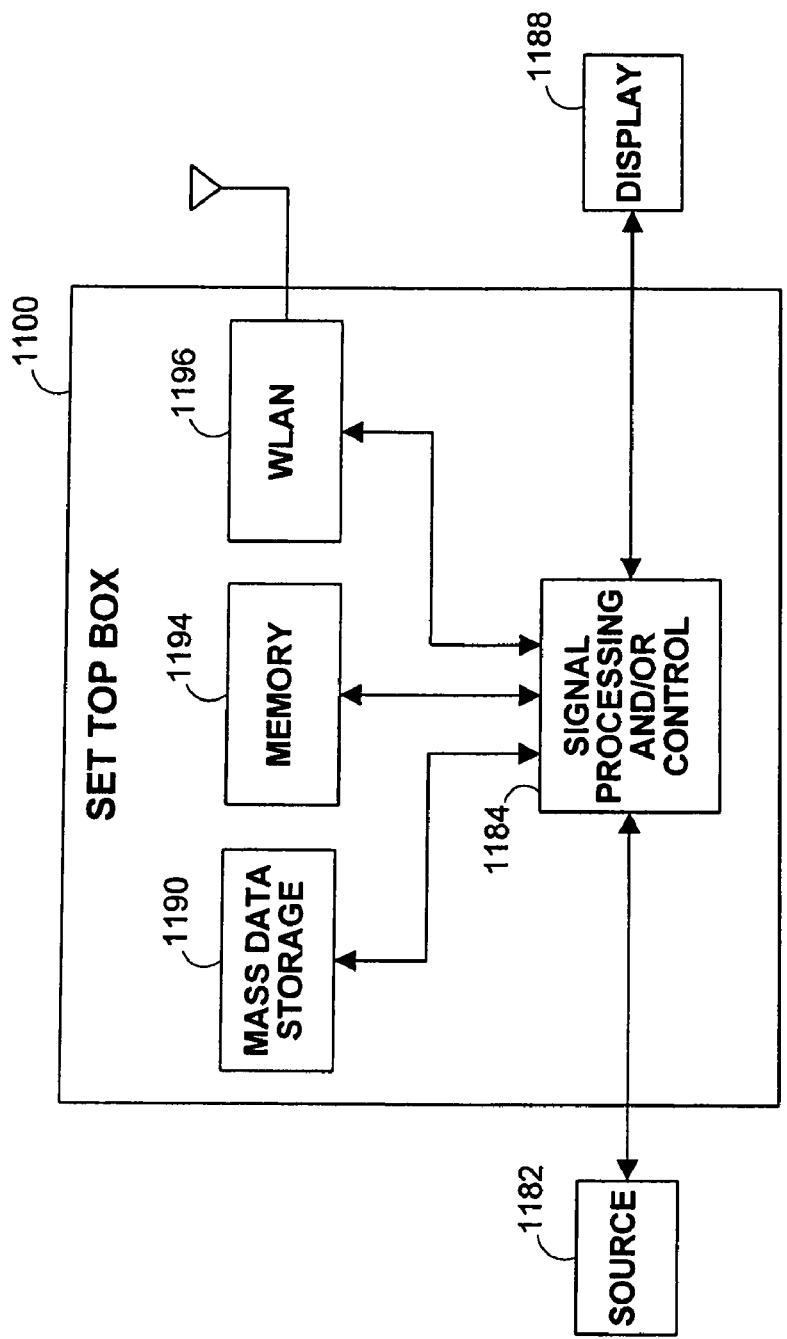
FIG. 8 is a block diagram of an exemplary set top box that can employ the disclosed technology.

Referring now to FIG. 8, the present invention can be implemented in a set top box 1100. The present invention may implement either or both signal processing and/or control circuits, which are generally identified in FIG. 8 at 1184, a WLAN interface and/or mass data storage of the set top box 1180. Set top box 1180 receives signals from a source 1182 such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1180 may process data, perform coding and/or encryption, perform calculations, format data and/or perform any other set top box function.

Set top box 1100 may communicate with mass data storage 1190 that stores data in a nonvolatile manner. The mass data storage 1190 may include optical and/or magnetic storage devices for example hard disk drives HDD and/or DVDs. At least one HDD may have the configuration shown in FIG. 3 and/or at least one DVD drive may have the configuration shown in FIG. 4. The HDD may be a mini-HDD that includes one or more platters having a diameter that is smaller than approximately 1.8". Set top box 1100 may be connected to memory 1194 such as RAM, ROM, low-latency nonvolatile memory such as flash memory, and/or other suitable electronic data storage. Set top box 1100 also may support connections with a WLAN via a WLAN network interface 1196.

Figure 9:
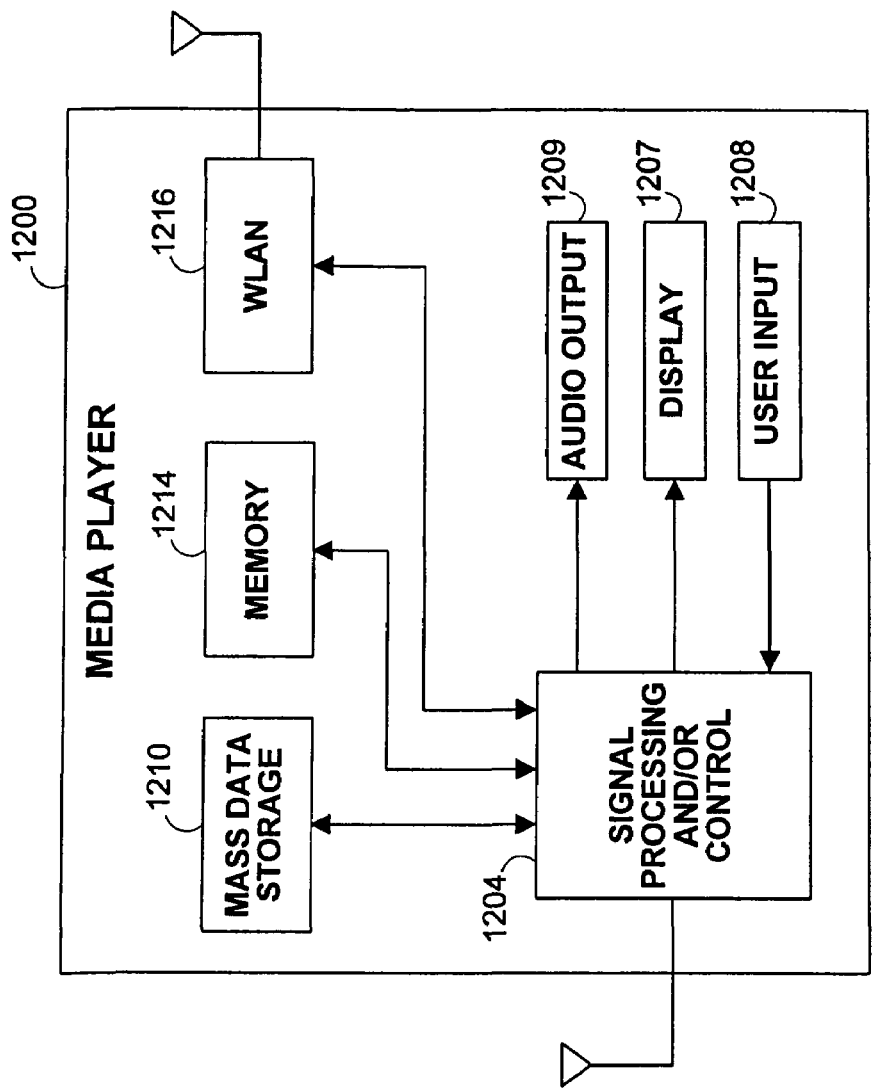
FIG. 9 is a block diagram of an exemplary media player that can employ the disclosed technology.

Referring now to FIG. 9, the present invention can be implemented in a media player 1200. The present invention may implement either or both signal processing and/or control circuits, which are generally identified in FIG. 9 at 1204, a WLAN interface and/or mass data storage of the media player 1200. In some implementations, the media player 1200 includes a display 1207 and/or a user input 1208 such as a keypad, touchpad and the like. In some implementations, the media player 1200 may employ a graphical user interface (GUI) that typically employs menus, drop down menus, icons and/or a point-and-click interface via the display 1207 and/or user input 1208. Media player 1200 further includes an audio output 1209 such as a speaker and/or audio output jack. The signal processing and/or control circuits 1204 and/or other circuits (not shown) of media player 1200 may process data, perform coding and/or encryption, perform calculations, format data and/or perform any other media player function.

Media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 3 and/or at least one DVD drive may have the configuration shown in FIG. 4. The HDD may be a mini-HDD that includes one or more platters having a diameter that is smaller than approximately 1.8". Media player 1200 may be connected to memory 1214 such as RAM, ROM, low-latency nonvolatile memory such as flash memory, and/or other suitable electronic data storage. Media player 1200 also may support connections with a WLAN via a WLAN network interface 1216. Still other implementations in addition to those described above are contemplated.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A variable gain amplifier comprising:
a first amplifier component; and
a first modulating circuit for varying gain of said first amplifier component, said first modulating circuit including a first resistive ladder circuit having:
a plurality of first rung resistances, including:
a plurality of first parallel resistances, each resistance in said plurality of first parallel resistances having a substantially identical rung resistance value, and a basic resistance in parallel with said plurality of first parallel resistances and having a basic resistance value,
a first stile including a respective first stile resistance connecting respective first ends of respective adjacent ones of said first rung resistances, each of said first stile resistances having a first stile resistance value, and
a second stile comprising a conductor connected to respective second ends of said first rung resistances, said modulating circuit further including:
a respective first switch for selecting each said rung; wherein:
each said first end of each said first rung resistance is a ladder input of said first resistive ladder circuit;
said first resistive ladder circuit has a ladder output across said first and second stiles at an end opposite said basic resistance;
said first stile resistance value is a fraction of said basic resistance value; and
said first rung resistance value is substantially equal to a product of (a) said basic resistance value and (b) 1 plus an inverse of said fraction.

2. The variable gain amplifier of claim 1 wherein for first switches selecting respective outputs separated from one another by a number of rungs, said respective outputs differ in dB by a number of substantially identical first steps equal to said number of rungs.

3. The variable gain amplifier of claim 1 wherein:
said first amplifier component is a first operational amplifier having a grounded first noninverting input, and having a first inverting input;
said first modulating circuit comprises a first feedback circuit in communication with said first stile, adjacent said basic resistance, and with said first inverting input, said second stile being connected to a voltage supply; said variable gain amplifier further comprising:
a first transistor at an output of said first operational amplifier;
a current source arranged at a source of said transistor, a drain of said first transistor being connected to ground; wherein:
each said respective first switch is arranged between said first stile and said source of said transistor.

4. The variable gain amplifier of claim 3 wherein:
said first amplifier component is a differential amplifier having two said inverting inputs; and
said variable gain amplifier comprises two of said first modulating circuit, one for each of said two inverting inputs.

5. The variable gain amplifier of claim 3 wherein:
said basic resistance value is R;
said first stile resistance value is $\alpha R$; and
each said first step is substantially equal to $20 \log_{10}(1+\alpha)$ dB.

6. The variable gain amplifier of claim 3 wherein said first amplifier component and said first modulating circuit form a first stage of said variable gain amplifier, said variable gain amplifier further including a second stage between said drain of said first transistor and ground, said second stage comprising:
a second amplifier component; and
a second modulating circuit for varying gain of said amplifier component, said modulating circuit including a second resistive ladder circuit having:
a plurality of second rung resistances, including:
a plurality of second parallel resistances, each resistor in said plurality of second parallel resistances having a substantially identical second rung resistance value, and a base resistance in parallel with said plurality of second parallel resistances and having a base resistance value,
a third stile including a respective second-stage stile resistance connecting respective first ends of respective adjacent ones of said second rung resistances, each of said second-stage stile resistances having a second-stage stile resistance value, and
a fourth stile comprising a conductor connected to respective second ends of said second rung resistances and ending one rung closer to said base resistance than said third stile, said second modulating circuit further including:
a respective second-stage switch for selecting each said rung; wherein:
each said first end of each said second rung resistance is a ladder input of said second resistive ladder circuit;
said second resistive ladder circuit has a ladder output across said third and fourth stiles at an end opposite said base resistance;
said second-stage stile resistance value is a fraction of said base resistance value;
said second rung resistance value is substantially equal to a product of (a) said base resistance value and (b) 1 plus an inverse of said fraction;
for switches selecting respective outputs separated from one another by a number of second-stage rungs, said respective outputs differ in dB by a number of substantially identical second steps equal to said number of second-stage rungs; and
said first and second stages are arranged such that gain in dB of said first stage and gain in dB of said second stage are additive.

7. The variable gain amplifier of claim 6 wherein:
said second amplifier component is a second operational amplifier having a grounded second noninverting input, and having a second inverting input;
said second modulating circuit comprises a second feedback circuit in communication with said third stile, at an end opposite said base resistance, and with said second inverting input, said second stile being grounded; said variable gain amplifier further comprising:
a second transistor at an output of said second operational amplifier;
a current source arranged between a source of said second transistor and ground; wherein:
each said respective second switch is arranged between said third stile and said source of said first transistor; and
a source of said second transistor is output of said variable gain amplifier.

8. The variable gain amplifier of claim 7 wherein:
said second amplifier component is a differential amplifier having two said inverting inputs; and said variable gain amplifier comprises two of said second modulating circuit, one for each of said two inverting inputs.

9. The variable gain amplifier of claim 6 wherein:
said basic resistance value is $R_1$;
said first stile resistance value is $\alpha R_1$;
each said first step is substantially equal to $20 \log_{10}(1+\alpha)$ dB;
said base resistance value is $R_2$;
said second-stage stile resistance value is $\beta R_2$;
each said second step is substantially equal to $20 \log_{10}(1+\beta)$ dB.

10. A variable gain amplifier comprising:
first amplifier component means; and
first modulating means for varying gain of said first amplifier component means, said first modulating means including first resistive ladder means having:
a plurality of first rung resistance means, including:
a plurality of first parallel resistance means, each resistance means in said plurality of first parallel resistance means having a substantially identical rung resistance value, and a basic resistance means in parallel with said plurality of first parallel resistance means and having a basic resistance value,
first stile means including a respective first stile resistance means connecting respective first ends of respective adjacent ones of said first rung resistance means, each of said first stile resistance means having a first stile resistance value, and
second stile means comprising conductor means connected to respective second ends of said first rung resistance means, said first modulating circuit means further including:
respective first switch means for selecting each said rung; wherein:
each said first end of each said first rung resistance means is a ladder input of said first resistive ladder means;
said first resistive ladder means has a ladder output across said first and second stile means at an end opposite said basic resistance means;
said first stile resistance value is a fraction of said basic resistance value; and
said first rung resistance value is substantially equal to a product of (a) said basic resistance value and (b) 1 plus an inverse of said fraction.

11. The variable gain amplifier of claim 10 wherein for first switches selecting respective outputs separated from one another by a number of rungs, said respective outputs differ in dB by a number of substantially identical first steps equal to said number of rungs.

12. The variable gain amplifier of claim 10 wherein:
said first amplifier component means is a first operational amplifier means having a grounded first noninverting input, and having a first inverting input;
said first modulating means comprises a first feedback means connected by said first stile, adjacent said basic resistance, to said first inverting input, said second stile being connected to a voltage supply; said variable gain amplifier further comprising:
first transistor means at an output of said first operational amplifier means;
a current source connected to a source of said first transistor means, a drain of said first transistor means being connected to ground; wherein:
each said respective first switch means is connected between said first stile and said source of said first transistor means.

13. The variable gain amplifier of claim 12 wherein:
said first amplifier component means is a differential amplifier means having two said inverting inputs; and
said variable gain amplifier means comprises two of said first modulating means, one for each of said two inverting inputs.

14. The variable gain amplifier of claim 12 wherein:
said basic resistance value is R;
said first stile resistance value is $\alpha R$; and
each said first step is substantially equal to $20 \log_{10}(1+\alpha)$ dB.

15. The variable gain amplifier of claim 12 wherein said first amplifier component means and said first modulating means form a first stage of said variable gain amplifier, said variable gain amplifier further including a second stage comprising:
second amplifier component means; and
a second modulating means for varying gain of said first amplifier component means, said second modulating means including a second resistive ladder means having:
a plurality of second rung resistance means, including:
a plurality of second parallel resistance means, each resistance means in said plurality of second parallel resistance means having a substantially identical second rung resistance value, and a base resistance means in parallel with said plurality of second parallel resistance means and having a base resistance value,
third stile means including a respective second-stage stile resistance means connecting respective first ends of respective adjacent ones of said second rung resistance means, each of said second-stage stile resistance means having a second-stage stile resistance value, and
fourth stile means comprising conductor means connected to respective second ends of said second rung resistance means and ending one rung closer to said base resistor means than said third stile means, said second modulating means further including:
respective second-stage switch means for selecting each said rung; wherein:
each said first end of each said second rung resistance is a ladder input of said second resistive ladder means;
said second resistive ladder means has a ladder output across said third and fourth stiles at an end opposite said base resistance means;
said second-stage stile resistance value is a fraction of said base resistance value;
said second rung resistance value is equal to a product of (a) said base resistance value and (b) 1 plus an inverse of said fraction;
for switch means selecting respective outputs separated from one another by a number of second-stage rungs, said respective outputs differ in dB by a number of substantially identical second steps equal to said number of second-stage rungs; and
said first and second stages are arranged such that gain in dB of said first stage and gain in dB of said second stage are additive.

16. The variable gain amplifier of claim 15 wherein:
said second amplifier component means is a second operational amplifier means having a grounded second noninverting input, and having a second inverting input;
said second modulating means comprises a second feedback means connected by said third stile, at and end opposite said base resistance means, to said second inverting input, said second stile being grounded; said variable gain amplifier further comprising:

second transistor means at an output of said second operational amplifier means; and current source means connected between a drain of said second transistor means and ground; wherein:

each said respective second switch means is connected between said third stile and said drain of said first transistor means; and a source of said second transistor means is output of said variable gain amplifier.

17. The variable gain amplifier of claim 16 wherein:

said second amplifier component means is a differential amplifier having two said inverting inputs; and said variable gain amplifier comprises two of said second modulating means, one for each of said two inverting inputs.

18. The variable gain amplifier of claim 15 wherein:

said basic resistance value is $R_1$;

said first stile resistance value is $\alpha R_1$;

each said first step is substantially equal to $20 \log_{10}(1+\alpha)$ dB;

said base resistance value is $R_2$;

said second-stage stile resistance value is $\beta R_2$;

each said second step is substantially equal to $20 \log_{10}(1+\beta)$ dB.

19. A method of generating signals having variable gain in steps that are linear-in-dB, said method comprising:

providing a variable gain amplifier, said providing comprising:

providing a first amplifier component, and providing a first modulating circuit for varying gain of said first amplifier component, said providing a first modulating circuit comprising arranging a first resistive ladder circuit, said arranging including:

arranging a plurality of first rung resistors, including:

a plurality of first parallel resistors, each resistor in said plurality of first parallel resistors having a substantially identical rung resistance value, and a basic resistor in parallel with said plurality of first parallel resistors and having a basic resistance value, a first stile including a respective first stile resistor connecting respective first ends of respective adjacent ones of said first rung resistors, each of said first stile resistors having a first stile resistance value, and a second stile comprising a conductor connected to respective second ends of said first rung resistors, said providing a first modulating circuit further including:

arranging a respective first switch for selecting each said rung, wherein:

each said first end of each said first rung resistor is a ladder input of said first resistive ladder circuit, said first resistive ladder circuit has a ladder output across said first and second stiles at an end opposite said basic resistor, said first stile resistance value is a fraction of said basic resistance value, and said first rung resistance value is substantially equal to a product of (a) said basic resistance value and (b) 1 plus an inverse of said fraction; and closing a respective first switch selecting a respective output separated from other outputs by a number of rungs.

20. The method of claim 19 wherein said respective outputs differ in dB by a number of substantially identical first steps equal to said number of rungs.

21. The method of claim 19 wherein:

said basic resistance value is R;

said first stile resistance value is $\alpha R$; and each said first step is substantially equal to $20 \log_{10}(1+\alpha)$ dB.

22. The method of claim 19 wherein said first amplifier component and said first modulating circuit form a first stage of said variable gain amplifier, said method further comprising including in said variable gain amplifier a second stage comprising:

providing a second amplifier component, and providing a second modulating circuit for varying gain of said amplifier component, said providing a second modulating circuit including arranging a second resistive ladder circuit, said arranging a second resistive ladder circuit including:

arranging a plurality of second rung resistors, including:

a plurality of second parallel resistors, each resistor in said plurality of second parallel resistors having a substantially identical second rung resistance value, and a base resistor in parallel with said plurality of second parallel resistors and having a base resistance value, a third stile including a respective second-stage stile resistor connecting respective first ends of respective adjacent ones of said second rung resistors, each of said second-stage stile resistors having a second-stage stile resistance value, and a fourth stile comprising a conductor connected to respective second ends of said second rung resistors, said providing a second modulating circuit further including:

arranging a respective second-stage switch for selecting each said rung; wherein:

each said first end of each said second rung resistor is a ladder input of said second resistive ladder circuit, said second resistive ladder circuit has a ladder output across said third and fourth stiles at an end opposite said base resistor, said second-stage stile resistance value is a fraction of said base resistance value, said second rung resistance value is substantially equal to a product of (a) said base resistance value and (b) 1 plus an inverse of said fraction; and closing a respective second-stage switch selecting a respective second-stage output separated from other second-stage outputs by a number of rungs.

23. The method of claim 22 wherein said respective second-stage outputs differ in dB by a number of substantially identical second steps equal to said number of rungs.

24. The method of claim 23 wherein said first and second stages are arranged such that gain in dB of said first stage and gain in dB of said second stage are additive.

25. The method of claim 22 wherein:

said basic resistance value is $R_1$;

said first stile resistance value is $\alpha R_1$;

each said first step substantially equals $20 \log_{10}(1+\alpha)$ dB;

said base resistance value is $R_2$;

said second-stage stile resistance value is $\beta R_2$; and each said second step substantially equals $20 \log_{10}(1+\beta)$ dB.

* * * * *